United States Patent
Chen et al.

(10) Patent No.: US 8,212,256 B2
(45) Date of Patent: Jul. 3, 2012

(54) PIXEL STRUCTURE, DISPLAY PANEL, ELETRO-OPTICAL APPARATUS, AND METHOD THEREROF

(75) Inventors: Po-Lin Chen, Hsinchu (TW);
Chun-Nan Lin, Hsinchu (TW);
Shu-Feng Wu, Hsinchu (TW);
Wen-Ching Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 728 days.

(21) Appl. No.: 12/060,873

(22) Filed: Apr. 2, 2008

(65) Prior Publication Data

US 2009/0153056 A1 Jun. 18, 2009

(30) Foreign Application Priority Data

Dec. 17, 2007 (TW) .............................. 96148199 A (51) Int. Cl.
*H01L 29/04* (2006.01)
(52) U.S. Cl. ........... 257/72; 257/E29.151; 257/E21.414; 257/E29.117; 438/158
(58) Field of Classification Search .................... 257/72, 257/59, E21.414, E29.151, E29.117; 438/158
See application file for complete search history.

(56) References Cited

U.S. PATENT DOCUMENTS

| | | | |
|---|---|---|---|
| 6,255,706 B1 | 7/2001 | Watanabe et al. | |
| 6,350,995 B1 | 2/2002 | Sung et al. | |
| 6,376,861 B1 | 4/2002 | Yaegashi et al. | |
| 6,432,755 B2 | 8/2002 | Sung et al. | |
| 6,518,630 B2 | 2/2003 | You et al. | |
| 2004/0185683 A1 | 9/2004 | Nakamura | |
| 2005/0205870 A1* | 9/2005 | Yamazaki | 257/72 |
| 2006/0049404 A1* | 3/2006 | Park et al. | 257/72 |
| 2006/0110866 A1 | 5/2006 | Gan et al. | |
| 2007/0122649 A1 | 5/2007 | Lee et al. | |
| 2008/0099765 A1* | 5/2008 | Kim et al. | 257/59 |

FOREIGN PATENT DOCUMENTS

| | | |
|---|---|---|
| CN | 1851906 | 10/2006 |
| CN | 1964067 | 5/2007 |
| JP | 2001196374 | 7/2001 |
| TW | 595001 | 6/2004 |
| TW | I281260 | 5/2007 |
| TW | 200727491 | 7/2007 |

OTHER PUBLICATIONS

"Office Action of Taiwan Counterpart Application", issued on Nov. 25, 2011, p1-p12, in which the listed reference was cited.

* cited by examiner

*Primary Examiner* — David Vu
(74) *Attorney, Agent, or Firm* — Jianq Chyun IP Office (57) ABSTRACT

A pixel structure disposed on a substrate including a thin film transistor (TFT), a bottom capacitor electrode, a dielectric layer, an upper capacitor electrode, a passivation layer, and a pixel electrode is provided. The TFT having a source/drain and the bottom capacitor electrode are disposed on the substrate. The dielectric layer is disposed on the bottom capacitor electrode. The upper capacitor electrode has a semiconductor layer, a barrier layer, and a metal layer. The semiconductor layer is disposed on the dielectric layer above the bottom capacitor electrode. The barrier layer is disposed on the semiconductor layer. The metal layer whose material includes copper, a copper alloy, or a combination thereof is disposed on the barrier layer. The passivation layer covers the TFT and the upper capacitor electrode and has a first opening exposing the source/drain. The pixel electrode is electrically connected to the TFT through the first opening.

18 Claims, 11 Drawing Sheets

PIXEL STRUCTURE, DISPLAY PANEL, ELETRO-OPTICAL APPARATUS, AND METHOD THEREROF

CROSS-REFERENCE TO RELATED APPLICATION

This application claims the priority benefit of Taiwan application serial no. 96148199, filed on Dec. 17, 2007. The entirety the above-mentioned patent application is hereby incorporated by reference herein and made a part of specification.

BACKGROUND OF THE INVENTION

1. Field of the Invention

The present invention generally relates to a display apparatus, and more particularly, to a liquid crystal display (LCD) apparatus having copper electrodes.

2. Description of Related Art

The rapid development of a multimedia society mostly results from the fact that semiconductor elements or human-information display apparatuses have progressed by leaps and bounds. Among the display apparatuses, flat panel displays featuring superior characteristics of high definition, great space utilization, low power consumption, and non-radiation have gradually become mainstream products in the market. At this current stage, a thin film transistor liquid crystal display (TFT-LCD) is the most mature flat panel display. Specifically, an electrode lead line of great quality plays a key role in equipping the TFT-LCD with specific characteristics so as to comply with current demands on great dimension and high-resolution of the TFT-LCD.

Among various materials constituting the electrode line, copper is characterized by low resistivity, low coefficient of thermal expansion, high melting point, great thermal conductivity, high anti-electromigration, and so forth. Moreover, copper lines are able to approximately double the performance of TFT devices in comparison with aluminum leads. As long as the lines are made of copper, not only an RC delay can be minimized, but also electrostatic capacity between the copper lines can be reduced. As such, copper has become one of the most imperative conductive materials constituting the electrodes and the leads.

Since copper is not able to form a self-protective oxidation layer under an atmospheric environment, the copper lines are likely to be oxidized and corroded in a conventional manufacturing process of a pixel structure having the copper lines. In addition, the TFTs using copper as the electrodes are often deteriorated due to certain properties of copper. For instance, an adhesion between a copper electrode and a substrate is relatively unsatisfactory. Further, silicide may be formed by copper and silicon under a low temperature. Besides, copper has a high coefficient of diffusion in a dielectric layer. In light of the foregoing, the pixel structure using copper as the electrodes or the leads encounters practical challenges.

In general, as the material of a source and a drain of the TFT includes copper, a conventional pixel structure using copper as the electrodes has been proposed to avoid copper from being in direct contact with an active layer, an ohmic contact layer, and the dielectric layer (i.e. a gate insulating layer). In the TFT having said conventional pixel structure, a copper oxide layer serving as a barrier layer is often disposed between a copper layer and the active layer and between the copper layer and the dielectric layer, such that copper can be prevented from being diffused into the active layer. Additionally, the copper oxide layer is also conducive to promoting the adhesion between the copper layer and the substrate. It should be noted that an upper electrode of a storage capacitor of the pixel structure is made of copper as well. Moreover, the copper oxide layer as the barrier layer is required to be disposed between the copper layer and the dielectric layer for blocking copper from being diffused into the active layer and for enhancing the adhesion between the copper layer and the substrate.

Figure 1A:
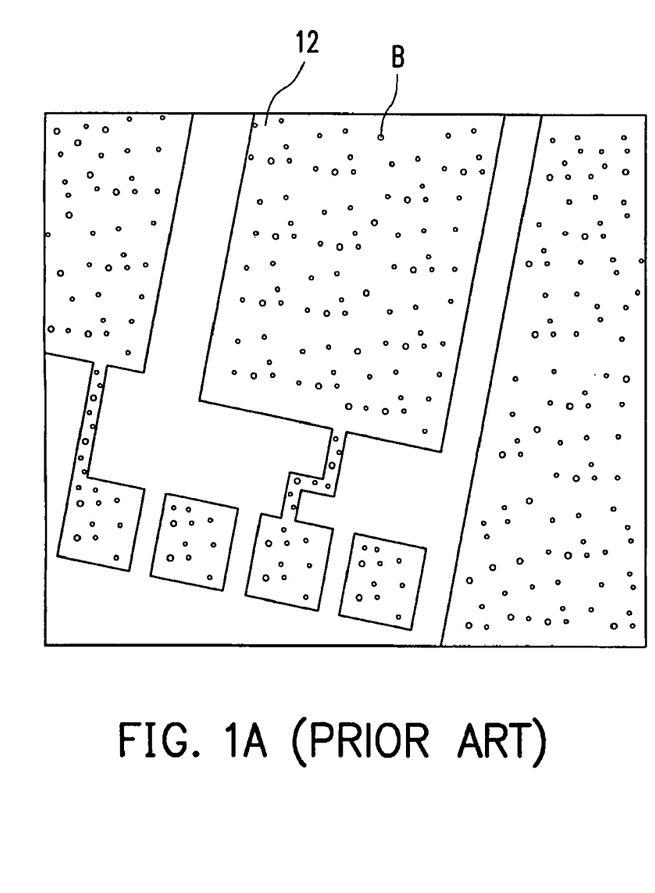
FIG. 1A is a schematic view illustrating a partial region of a conventional pixel structure observed by using an optical microscope.
Figure 1B:
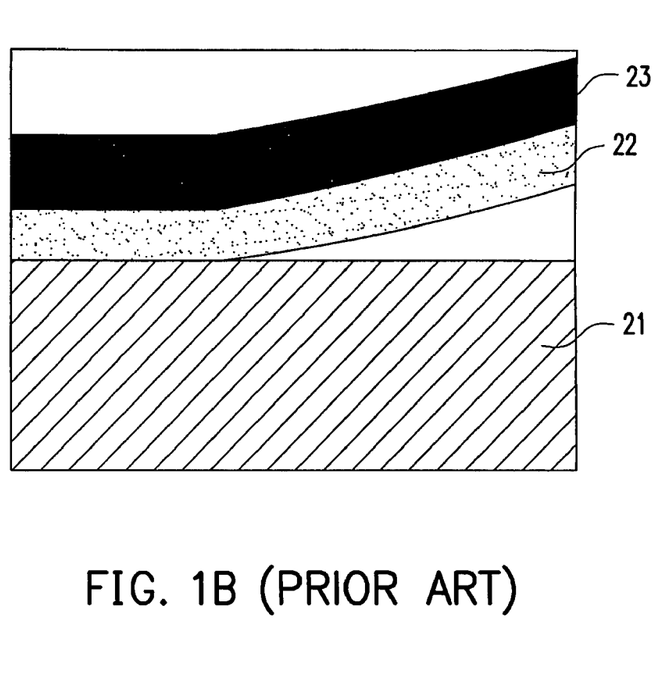
FIG. 1B is a schematic view illustrating a partial region of a conventional pixel structure observed by using an electronic microscope.

Nevertheless, in a subsequent process of manufacturing said pixel structure, the direct contact between the copper oxide layer and the dielectric layer brings about a reduction of the copper oxide at or around an interface between the copper oxide layer and the dielectric layer due to reactive gases generated in the subsequent process. Thereby, the copper layer may be peeled off, or bubbles may be generated, as illustrated in FIGS. 1A and 1B. Aside from the above-mentioned reduction of the copper oxide, the reactive gases may be further diffused to the copper oxide at or around the interface of the copper oxide layer and the active layer and/or the ohmic contact layer, resulting in the peeling-off of the entire copper layer or the generation of the bubbles. Here, the subsequent process is, for example, a process of fabricating a passivation layer in which a chemical vapor deposition (CVD) process is performed for forming a silicon nitride film layer. Gases adopted in the process include the reactive gases (e.g. silicon-containing gases, nitrogen-containing gases) and carrier gases. For instance, the silicon-containing gases include silane, disilane, trisilane, tetraethyl orthosilane (TEOS), tetra-silane, other gases, or combinations thereof. The nitrogen-containing gases include nitrogen, ammonia, other gases, or combinations thereof. The carrier gases include nitrogen, oxygen, helium, neon, argon, krypton, xenon, radon, other gases, or mixture gases selected from the above gases. It should be noted that the passivation layer made of different materials gives rise to the production of different reactive gases and different carrier gases, and all of the gases cause the aforesaid problems. FIG. 1A is a schematic view illustrating a partial region of the pixel structure in which the bubbles are generated in the copper layer according to an observation result obtained by an optical microscope. Referring to FIG. 1A, a copper electrode 12 made of copper generates bubbles B in the subsequent process. FIG. 1B is a schematic view illustrating a partial region of the pixel structure in which the copper layer is peeled off according to an observation result obtained by an electron microscope. Referring to FIG. 1B, a copper electrode 22 is peeled off from a bottom layer 21, such that an upper film layer 23 disposed on the copper electrode 22 is also peeled off. As shown in FIG. 1A, the copper electrode 12 serving as the line is peeled off in the subsequent process because of the production of the bubbles B. Therefore, it is a to-be-resolved crucial issue for the copper electrode and the copper line to be applied to the manufacturing process of the pixel structure.

SUMMARY OF THE INVENTION

The present invention is directed to a pixel structure having a metal layer with satisfactory adhesion, wherein the metal layer is made of copper, a copper alloy, or a combination thereof.

The present invention is further directed to a method of manufacturing a pixel structure, wherein the method is able to prevent a metal layer made of copper, a copper alloy, or a combination thereof from being peeled off.

The present invention is further directed to a display panel having said pixel structure.

The present invention is further directed to an electro-optical apparatus having a display panel discussed herein.

The present invention is further directed to a method of manufacturing a display panel, in which a method of manufacturing a pixel structure is able to prevent a metal layer made of copper, a copper alloy, or a combination thereof from being peeled off.

The present invention is further directed to a method of manufacturing an electro-optical apparatus, in which a method of manufacturing a pixel structure is able to prevent a metal layer made of copper, a copper alloy, or a combination thereof from being peeled off.

To embody the present invention, a pixel structure is provided herein. The pixel structure is disposed on a substrate including a TFT, a bottom capacitor electrode, a dielectric layer, an upper capacitor electrode, a passivation layer, and a pixel electrode. The TFT has a source/drain. The TFT and the bottom capacitor electrode are disposed on the substrate. The dielectric layer is disposed on the bottom capacitor electrode. The upper capacitor electrode has a semiconductor layer, a barrier layer, and a metal layer. The semiconductor layer is disposed on the dielectric layer above the bottom capacitor electrode. The barrier layer is disposed on the semiconductor layer. The metal layer whose material includes copper, a copper alloy or a combination thereof is disposed on the barrier layer. The passivation layer covers the TFT and the upper capacitor electrode and has a first opening exposing the drain/source. The pixel electrode is electrically connected to the TFT through the first opening.

The present invention further provides a method of manufacturing a pixel structure. The method includes providing a first substrate at first. A gate and a bottom capacitor electrode are then formed on the substrate. A dielectric layer is formed on the substrate to cover the gate and the bottom capacitor electrode. After that, a semiconductor layer is formed on the dielectric layer. Next, the semiconductor layer is patterned to form a channel layer on the dielectric layer above the gate, and a patterned semiconductor layer is formed on the dielectric layer above the bottom capacitor electrode. Thereafter, a barrier layer and a conductive layer are sequentially formed on the channel layer, the dielectric layer, and the patterned semiconductor layer. The material of the conductive layer includes copper, a copper alloy, or combinations thereof. The barrier layer and the conductive layer are then patterned to form a source and a drain on the channel layer at respective sides of the gate, and a copper-containing stacked layer is formed on the semiconductor layer. The gate, the channel layer, the source and the drain constitute a TFT, while the patterned semiconductor layer and the copper-containing stacked layer together form an upper capacitor electrode. After that, a passivation layer is formed on the TFT and the upper capacitor electrode. The passivation layer has a first opening exposing the drain/source. A pixel electrode is then formed. The pixel electrode is electrically connected to the TFT through the first opening.

The present invention further provides a pixel structure disposed on a substrate. The pixel structure includes a TFT, a passivation layer, and a pixel electrode. The TFT includes a gate, a dielectric layer, a channel layer, and a source/drain sequentially disposed on the substrate, such that the source/drain is disposed on a portion of a semiconductor layer. The source/drain has a barrier layer and a metal layer. The barrier layer is disposed on a portion of the semiconductor layer. The metal layer is disposed on the barrier layer. The barrier layer is in contact with the semiconductor layer and the metal layer. Here, the material of the metal layer includes copper, a copper alloy, or a combination thereof. The passivation layer covers the TFT and the dielectric layer and has a first opening exposing the drain/source. The pixel electrode is disposed on the passivation layer and electrically connected to the TFT through the first opening.

The present invention further provides a method of manufacturing a pixel structure. The method includes providing a first substrate at first. A gate, a dielectric layer, a semiconductor layer, and a source/drain are then sequentially disposed on the substrate to form a TFT and to dispose the source/drain on a portion of the semiconductor layer. The source/drain has a barrier layer and a metal layer. The barrier layer is disposed on a portion of the semiconductor layer. The metal layer is disposed on the barrier layer. The barrier layer is in contact with the semiconductor layer and the metal layer. Here, the material of the metal layer includes copper, a copper alloy, or a combination thereof. The TFT and the dielectric layer are then covered by a passivation layer having a first opening which exposes the drain/source. Next, a pixel electrode is disposed on the passivation layer and electrically connected to the TFT through the first opening.

The present invention further provides a display panel having said pixel structure discussed in several embodiments of the present invention.

The present invention further provides an electro-optical apparatus having said pixel structure discussed in several embodiments of the present invention.

The present invention further provides a method of manufacturing a display panel. The method includes the method of manufacturing said pixel structure discussed in several embodiments of the present invention.

The present invention further provides a method of manufacturing an electro-optical apparatus. The method includes the method of manufacturing said pixel structure discussed in several embodiments of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2A:
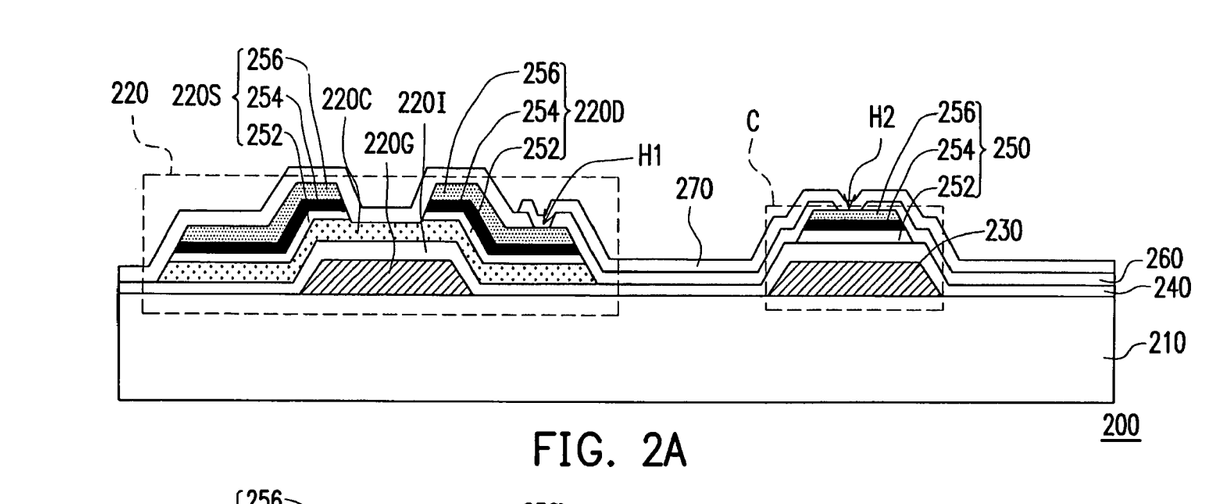
FIG. 2A is a schematic view illustrating a pixel structure according to the present invention.

FIG. 2A is a schematic view illustrating a pixel structure according to the present invention. Referring to FIG. 2A, a pixel structure 200 disposed on a substrate 210 includes a TFT 220, a bottom capacitor electrode 230, a dielectric layer 240, an upper capacitor electrode 250, a passivation layer 260, and a pixel electrode 270. The TFT 220 and the bottom capacitor electrode 230 are disposed on the substrate 210. The passivation layer 260 covers the TFT 220 and the upper capacitor electrode 250 and has at least a first opening H1 exposing a drain 220D. The pixel electrode 270 is electrically connected to the TFT 220 through the first opening H1. Besides, in the present embodiment, the passivation layer 260 preferably has at least a second opening H2 exposing the upper capacitor electrode 250, and the pixel electrode 270 is electrically connected to the upper capacitor electrode 250 through the second opening H2, which is not limited in the present invention. Alternatively, the passivation layer 260 can also have no second opening H2, such that the upper capacitor electrode 250 is not exposed.

Referring to FIG. 2A, the dielectric layer 240 is disposed on the bottom capacitor electrode 230. In the present embodiment, the material of the dielectric layer 240 is substantially the same as the material of a gate insulating layer 220I, which is not limited in the present invention. In other words, the material of the dielectric layer 240 and the material of the gate insulating layer 220I may also be substantially different. Note that the upper capacitor electrode 250 includes a semiconductor layer 252, a barrier layer 254, and a metal layer 256. The semiconductor layer 252 is disposed on the dielectric layer 240 above the bottom capacitor electrode 230 and can be made of amorphous silicon (a-Si), mono-crystalline, micro-silicon, polysilicon, an N-type doped silicide with said lattice(s), a P-type doped silicide with said lattice(s), a germanium silicide with said lattice(s), other materials, or combinations thereof. Besides, the semiconductor layer 252 can be of a single-layered structure or a multi-layered structure, which is not limited in the present invention. For example, the semiconductor layer 252 may have the single-layered structure comprising a-Si and/or heavily doped N-type a-Si or have a double-layered structure including a-Si and heavily doped N-type a-Si. Said structure can be arranged in a horizontal manner or in a vertical manner. In the present embodiment, the semiconductor layer 252 has the single-layered structure comprising the heavily doped N-type a-Si (i.e. an ohmic contact layer). The thickness of the semiconductor layer 252 preferably ranges from 10 nm to 300 nm, which is not limited in the present invention.

Referring to FIG. 2A, the barrier layer 254 is disposed on the semiconductor layer 252, and the material of the barrier layer 254 includes copper oxide, and the copper oxide has other element comprises molybdenum, neodymium, zirconium, titanium, magnesium, nickel, hafnium, tungsten, tantalum, vanadium, tin, manganese, or combinations thereof, for example. In other words, the above-mentioned other element can be soluble in copper oxide and hence to formed a copper oxide solid solution or namely a copper oxide mixture, for example. In the present embodiment, the concentration of oxygen in the copper oxide substantially ranges from 3% to 30%, which is not limited in the present invention. It notes that copper oxide further comprising a copper alloy oxide or a combination comprises the copper oxide and copper alloy oxide. Besides, the material of the barrier layer also includes refractory metals (e.g. titanium, tantalum, tungsten, platinum, aluminum, barium, niobium, columbium, molybdenum, nickel, cobalt, chromium, and so on), alloys thereof, or combinations thereof. In the present embodiment, the thickness of the barrier layer 254 preferably substantial ranges from 3 nm to 50 nm, which is not limited in the present invention. The metal layer 256 disposed on the barrier layer 254 may be of the single-layered structure or of the multi-layered structure, and the material of the metal layer 256 includes copper, a copper alloy, or a combination thereof. Here, the combination thereof is referred to as the combined materials used in the multi-layered structure or in the single-layered structure (e.g. mixing the copper alloy into copper, mixing copper into the copper alloy, or combining copper and the copper alloy in other manners). In detail, the metal layer 256 is made of the copper alloy or the copper has other element comprises molybdenum, neodymium, zirconium, titanium, magnesium, nickel, hafnium, tungsten, tantalum, vanadium, tin, or manganese, for example. In addition, according to the present embodiment, the metal layer 256 of the upper capacitor electrode 250 is electrically connected to the pixel electrode 270 through the second opening H2 of the passivation layer 260. In other words, in the pixel structure 200, the upper capacitor electrode 250 and the pixel electrode 270 are substantially at the same voltage level, such that the bottom capacitor electrode 230, the dielectric layer 240, and the upper capacitor electrode 250 together form a storage capacitor C for preserving a data voltage of the pixel structure 200.

It should be noted that the metal layer 256 made of copper, the copper alloy, or the combination thereof and the barrier layer 254 are attached to the dielectric layer 240 through the semiconductor layer 252. The semiconductor layer 252 is able to protect the metal layer 256 made of copper, the copper alloy, or the combination thereof and the barrier layer 254 from being damaged in subsequent processes. On the other hand, the material of the passivation layer 260 includes an inorganic material (e.g. silicon nitride, silicon oxynitride, silicon oxide, any other material, or combinations thereof), any other dielectric material (e.g. fluorinated oxide (FSG), benzocyclobutene (BCB), polyarylene ether (PAE), parylene, fluoro-polymer, black diamond, hydrogen silsesquioxane (HSQ), methylsilesquioxane (MSQ), polymethylmethacrylate, zinc oxide, hafnium oxide, any other material, or combinations thereof), or combinations thereof. In the present embodiment, the passivation layer 260 is made of the inorganic material such as silicon nitride or silicon oxide, and the passivation layer 260 is formed by depositing the passivation layer 260 on the substrate 210 through performing a plasma CVD process. Thereafter, the passivation layer 260 is patterned to form at least one first opening H1 and at least one second opening H2. Nevertheless, the plasma contains highly reactive free radicals and reactive gases characterized by superior reducibility, such as silane and ammonia. As such, when the passivation layer 260 is actually deposited through the plasma CVD process, the metal layer 256 made of copper, the copper alloy, or the combination thereof and the barrier layer 254 are likely to be damaged by the plasma, such that the metal layer 256 and the barrier layer 254 may peel off or generate bubbles. Note that the semiconductor layer 252 of the present invention is able to serve as a bottom buffer layer of the metal layer 256 made of copper, the copper alloy, or the combination thereof and the barrier layer 254, thus effectively preventing the metal layer 256 and the barrier layer 254 from being damaged by the plasma. If the passivation layer 260 is made of other dielectric materials, a CVD process with no use of the plasma (i.e. a coating process or a spin-coating process), the plasma CVD process, or said two processes may be selectively performed in accordance with whether any additional passivation layer is formed in the subsequent processes.

Figure 2B:
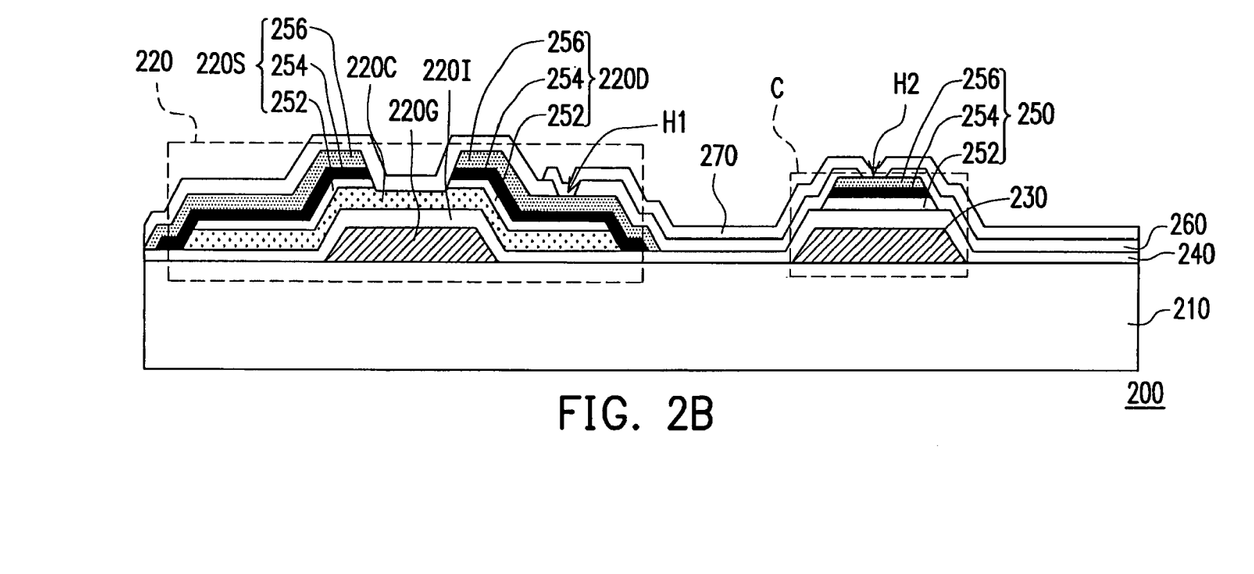
FIG. 2B is a schematic view illustrating a pixel structure according to the present invention.

Moreover, in the TFT 220 depicted in FIG. 2A, it is preferable for the metal layer 256 and the barrier layer 254 in the source 220S and the drain 220D to be positioned within a projection area of the semiconductor layer 252. For example, edges of the metal layer 256 and the barrier layer 254 in the source 220S and the drain 220D are aligned to an edge of the semiconductor layer 252. Here, the edges of the metal layer 256 and the barrier layer 254 away from the gate 220G are aligned to the edge of the semiconductor layer 252 away from the gate 220G. In an alternative, the edges of the metal layer 256 and the barrier layer 254 away from the gate 220G are located within the edge of the semiconductor layer 252 away from the gate 220G. That is to say, a bottom surface of the barrier layer 254 is in contact with an upper surface of the semiconductor layer 252 in the present embodiment, which is not limited in the present invention. Portions of the metal layer 256 and the barrier layer 254 in the source 220S and the drain 220D are located within the semiconductor layer 252, while the other portions of the metal layer 256 and the barrier layer 254 in the source 220S and the drain 220D are disposed on the dielectric layer 240, as depicted in FIG. 2B. FIG. 2B illustrates the pixel structure according to another embodiment of the present invention. In FIG. 2B, the bottom surface of the barrier layer 254 is in contact with the upper surface of the semiconductor layer 252, at least one edge of the semiconductor layer 252, and an upper surface of the dielectric layer 240. Besides, the metal layer 256 in the source 220S and the drain 220D covers an upper surface of the barrier layer 254 and at least an edge thereof. Alternatively, the metal layer 256 and the barrier layer 254 in the source 220S and the drain 220D cover the upper surface of the semiconductor layer 252 and at least one edge thereof. It should be mentioned that the portion of the barrier layer 254 on the dielectric layer 240 is still encapsulated by the metal layer 256, such that the barrier layer 254 is not affected and reduced by the reactive gases in the subsequent processes. Notwithstanding substances generated on an upper surface of the metal layer 256 may be affected and reduced by the reactive gases in the subsequent processes, the structure of the metal layer 256 is still not damaged thereby.

Figure 3:
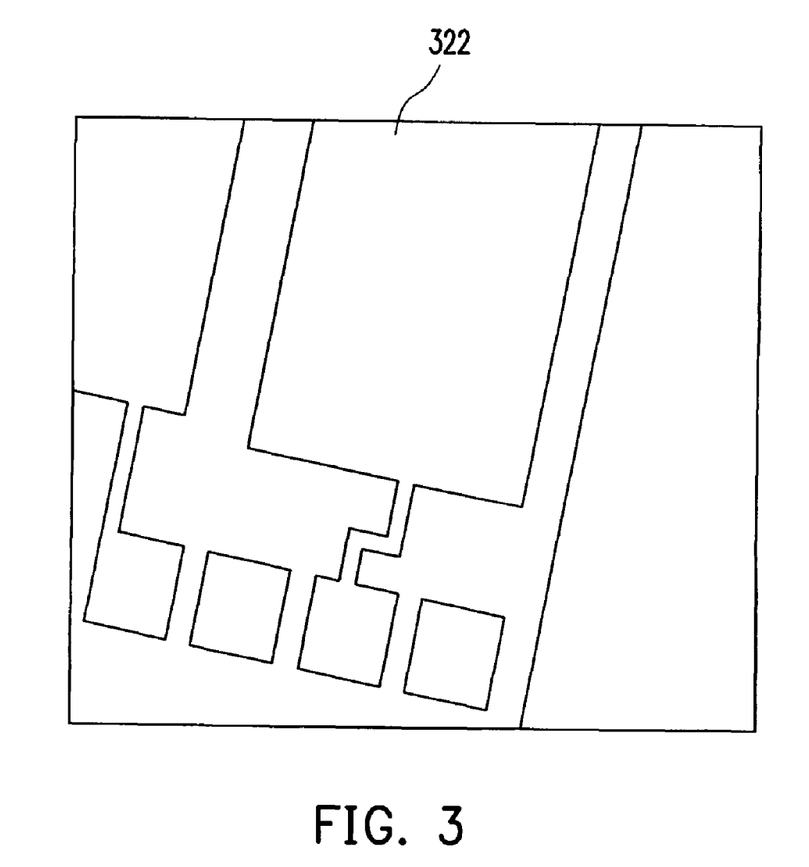
FIG. 3 is a schematic view illustrating a partial region of a pixel structure observed by using an optical microscope according to the present invention.

FIG. 3 a schematic view illustrating a partial region of a pixel structure observed by using an optical microscope according to the present invention. In comparison with the pixel structure provided by the related art, no bubbles are generated in the electrode 322 including the metal layer 256, the barrier layer 254 and the semiconductor layer 252, wherein the metal layer 256 is made of copper, the copper alloy, or the combination thereof after the implementation of the subsequent processes, nor is the electrode 322 containing the metal layer 256 peeled off, as indicated in FIG. 3. Unlike the copper electrode 12 (illustrated in FIG. 1A) and the copper electrode 22 (illustrated in FIG. 1B) disclosed in the related art, the semiconductor layer 252 provided in the present invention is able to protect the metal layer 256 made of copper, the copper alloy, or the combination thereof and the barrier layer 254 from being damaged in the subsequent processes, and thereby yield and performance of the pixel structure 200 can both be improved.

Figure 4:
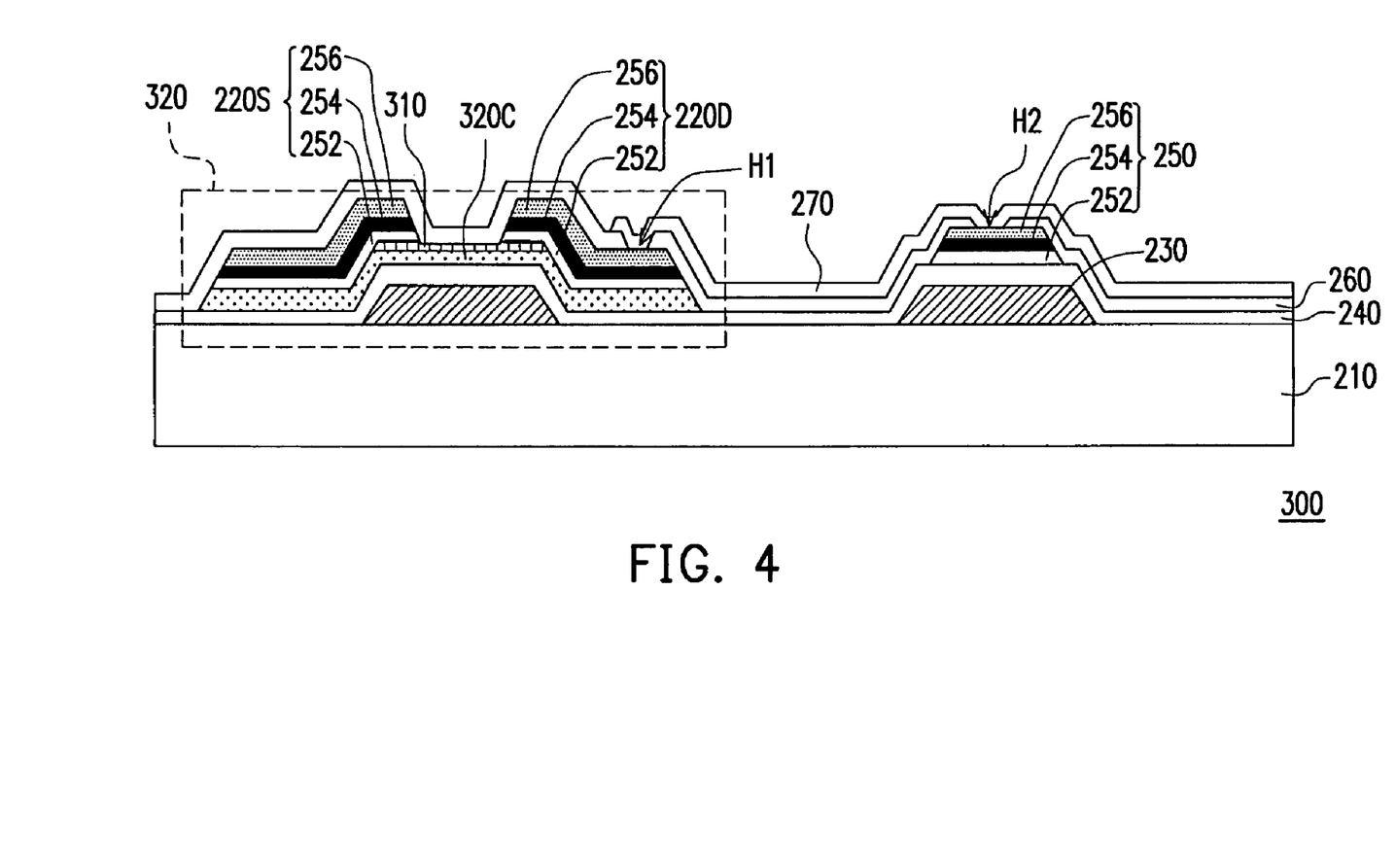
FIG. 4 is a schematic view illustrating another pixel structure according to the present invention.

Besides, referring to FIG. 2A, the TFT 220 includes the gate 220G, the gate insulating layer 220I, a channel layer 220C, the source 220S and the drain 220D. Note that the material of the source 220S and the drain 220D in the present embodiment is substantially the same as the material of the upper capacitor electrode 250. In other words, the semiconductor layer 252 having the single-layered structure constituted by the heavily doped N-type a-Si, the barrier layer 254 containing the copper oxide, and the metal layer 256 made of copper, the copper alloy, or the combination thereof are taken to exemplify the material of the source 220S and the drain 220D in the present embodiment. The composition of the copper oxide and that of the copper alloy are described above, and thus no further description is provided hereinafter. It is of certainty that the source 220S and the drain 220D of the TFT 220 can have the single-layered structure or the multi-layered structure formed by other conductive materials (e.g. aluminum, molybdenum, titanium, neodymium, gold, copper, chromium, silver, tantalum, tin, iron, alloys thereof, other materials, or combinations thereof). Namely, the structure of the TFT 220 is not limited in the present invention. Additionally, the material of the channel layer 220C includes a-Si, mono-crystalline, micro-silicon, polysilicon, a lightly-doped N-type silicide with said lattice(s), a lightly-doped P-type silicide with said lattice(s), a germanium silicide with said lattice(s), other materials, or combinations thereof. The material of the channel layer 220C is a semiconductor material. As indicated in FIGS. 2A and 2B, the channel layer 220C and the semiconductor layer 252 together form the stacked semiconductor layer having the multi-layered structure, which is not limited in the present invention. In the present embodiment, the channel layer 220C has the single-layered structure made of a-Si. On the other hand, the semiconductor layer 252 and the channel layer 220C can be arranged not only in a vertical manner as exemplified in the stacked semiconductor layer of the present invention, but also in a horizontal manner in the single-layered structure. Moreover, the arrangement of the semiconductor layer 252 and the channel layer 220C can be a combination of the above. That is to say, one single layer can include the heavily-doped semiconductor material, the lightly-doped semiconductor material, and/or the non-doped semiconductor material at the same time. FIG. 4 is a schematic view illustrating another pixel structure 300 according to the present invention. Referring to FIG. 4, a TFT 320 of the pixel structure 300 further includes an etching stop layer 310 disposed over a channel layer 320C. The etching stop layer 310 has the single-layered structure or the multi-layered structure, and the material of the etching stop layer 310 is, for example, an insulating material has silicon nitride, which is not limited in the present invention. Namely, other materials can also be utilized to form the etching stop layer 310. Here, no further description of the pixel structure 300 is provided, for the elements of the pixel structure 300 are similar to those of the pixel structure 200 discussed hereinbefore.

Moreover, in the TFT 320 depicted in FIG. 4, it is preferable for the metal layer 256 and the barrier layer 254 of the source 220S and the drain 220D to be positioned within the projection area of the semiconductor layer 252. For example, the edges of the metal layer 256 and the barrier layer 254 in the source 220S and the drain 220D are aligned to the edge of the semiconductor layer 252. Here, the edges of the metal layer 256 and the barrier layer 254 and the edge of the semiconductor layer 252 are away from the gate 220G. In an alternative, the edges of the metal layer 256 and the barrier layer 254 away from the gate 220G are located within the edge of the semiconductor layer 252. That is to say, in the present embodiment, the bottom surface of the barrier layer 254 is in contact with the upper surface of the semiconductor layer 252, which is not limited in the present invention. Portions of the metal layer 256 and the barrier layer 254 in the source 220S and the drain 220D are located within the semiconductor layer 252, while the other portions of the metal layer 256 and the barrier layer 254 in the source 220S and the drain 220D are disposed on the dielectric layer 240. In other words, the bottom surface of the barrier layer 254 is in contact with the upper surface of the semiconductor layer 252, at least one edge of the semiconductor layer 252, and the upper surface of the dielectric layer 240. Besides, the metal layer 256 in the source 220S and the drain 220D covers the upper surface of the barrier layer 254 and at least one edge thereof. Alternatively, the metal layer 256 and the barrier layer 254 in the source 220S and the drain 220D cover the upper surface of the semiconductor layer 252 and at least one edge thereof.

Figure 5A:
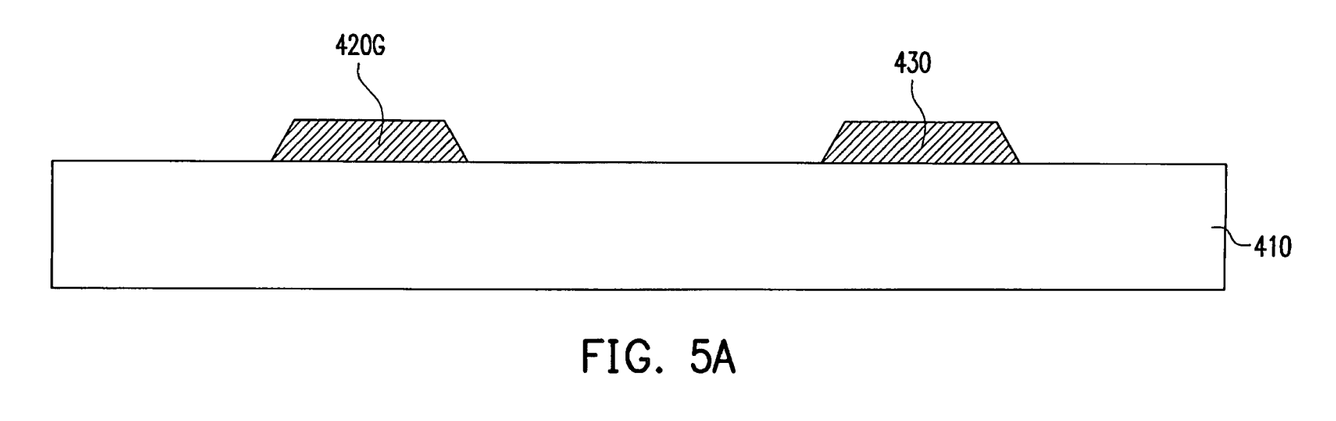
FIGS. 5A through 5G depict a method of manufacturing a pixel structure according to the present invention.

FIGS. 5A through 5G depict a method of manufacturing a pixel structure according to the present invention. Referring to FIG. 5A, a substrate 410 is first provided. The material of the substrate 410 is, for example, a transparent material (e.g. glass, quartz, or others), a non-transparent material (e.g. silicon, ceramic, or others), a flexible material (e.g. slimming glass, plastic, rubber, polyalkene, polyketone, polyalkane, polyalcohols, polyester, polyphenylene, polyalkylene oxide, polynaphthene, polyalkyne, polythiourea, polyimide, polyether, polyaldehyde, polyphenol, other polymers, derivatives thereof, or combinations thereof), or combinations thereof. A gate 420G and a bottom capacitor electrode 430 are then formed on the substrate 410. The method of forming the gate 420G and the bottom capacitor electrode 430 includes forming a conductive layer on the substrate 410 and then patterning the conductive layer for forming the gate 420G and the bottom capacitor electrode 430. The conductive layer can be a single-layered structure or a multi-layered structure, and the conductive layer is, for example, formed by performing a sputtering process, an evaporation process, or other film deposition processes, which is not limited in the present invention. Alternatively, the conductive layer can also be formed by simultaneously implementing the patterning process and the film deposition process, such as a stencil printing process, the coating process, an energizer process, and so on.

Figure 5B:
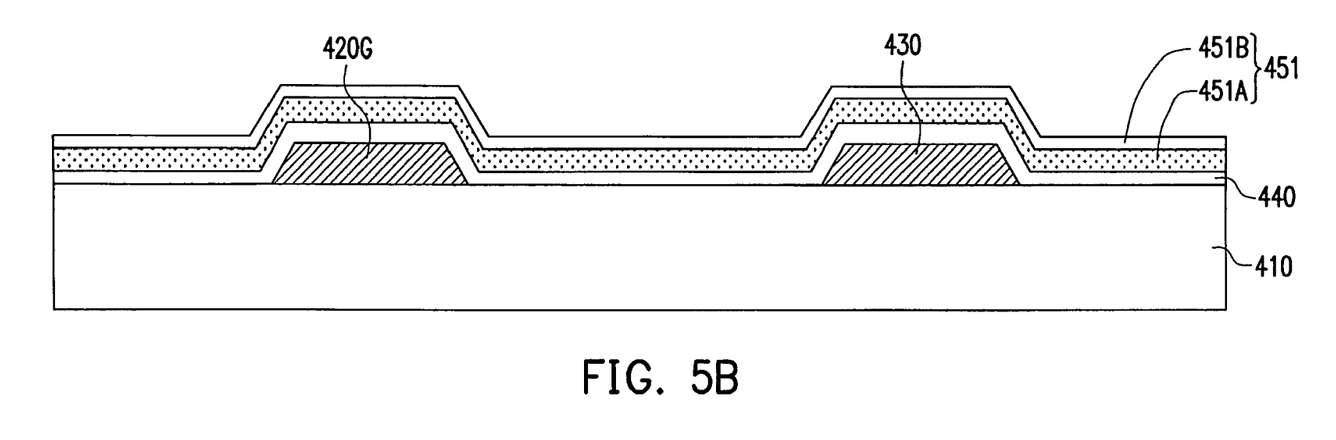

Thereafter, referring to FIG. 5B, a dielectric layer 440 is formed on the substrate 410 to cover the gate 420G and the bottom capacitor electrode 430. The dielectric layer 440 is, for example, formed by performing the CVD process or other appropriate film deposition processes, which is not limited in the present invention. Alternatively, the dielectric layer 440 can also be formed by simultaneously implementing the patterning process and the film deposition process, such as the stencil printing process, the coating process, the energizer process, and so on. Besides, the dielectric layer 440 has the single-layered structure or the multi-layered structure, and the dielectric layer 440 is made of the inorganic material (e.g. silicon nitride, silicon oxynitride, silicon oxide, any other material, or combinations thereof), any other dielectric material (e.g. FSG, BCB, PAE, parylene, fluoro-polymer, black diamond, HSQ, MSQ, polymethylmethacrylate, zinc oxide, hafnium oxide, any other material, or combinations thereof), or combinations thereof. In the present embodiment, the dielectric layer 440 is made of the dielectric material including silicon oxide, silicon nitride, silicon oxynitride, or the like. After that, referring to FIG. 5B, a semiconductor layer 451 is formed on the dielectric layer 440. The semiconductor layer 451 has the single-layered structure or the multi-layered structure comprising a-Si and/or the N-type doped a-Si horizontally and/or vertically arranged, for example. According to the present embodiment, the semiconductor layer 451 has the double-layered structure constituted by an a-Si layer 451A and an N-type doped a-Si layer 451B, which is not limited in the present invention.

Figure 5C:
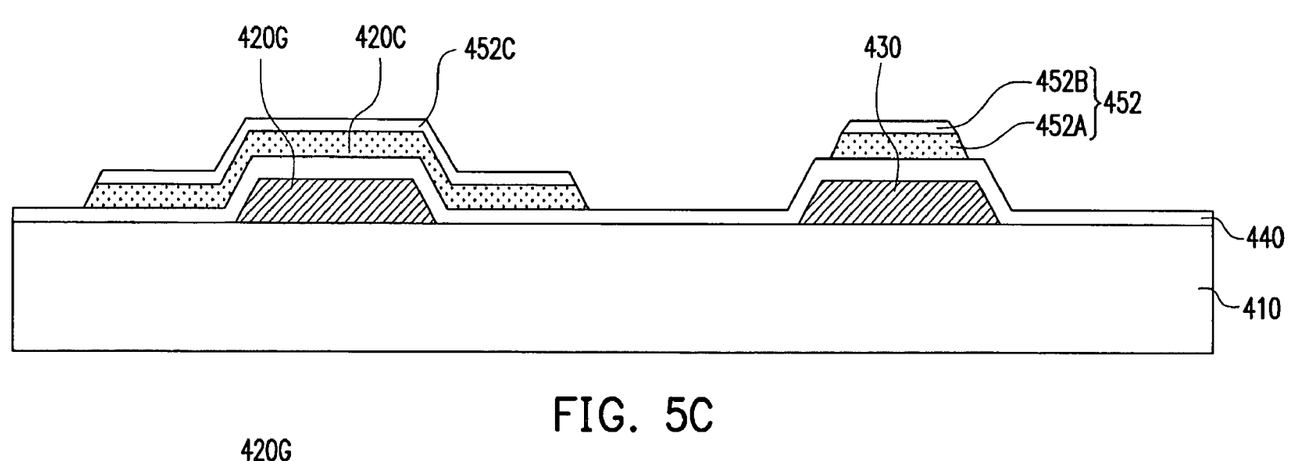

Next, referring to FIG. 5C, the semiconductor layer 451 (illustrated in FIG. 5B) is patterned, so as to form a channel layer 420C and an ohmic contact layer 452C on the dielectric layer 440 above the gate 420G. Note that the channel layer 420C and the ohmic contact layer 452C together form the semiconductor layer 451 (illustrated in FIG. 5B), but the dopant concentration of the channel layer 420C and the dopant concentration of the ohmic contact layer 452C are different. In detail, the channel layer 420C is formed by performing an ion implantation process with a low dopant concentration on the semiconductor layer 451 and then patterning the semiconductor layer 451 having the low dopant concentration, for example. Alternatively, the channel layer 420C is formed by patterning the non-doped semiconductor layer 451 without implementing any doping process. By contrast, the ohmic contact layer 452C is formed by performing an ion implantation process with a high dopant concentration on the semiconductor layer 451 and then patterning the semiconductor layer 451 having the high dopant concentration, for example. The process of patterning the channel layer 420C and the process of patterning the ohmic contact layer 452C are carried out at the same time, for example, which is not limited in the present invention. Namely, the patterning processes can be implemented at different times. In addition, referring to FIG. 5C, a patterned semiconductor layer 452 is formed on the dielectric layer 440 above the bottom capacitor electrode 430. The patterned semiconductor layer 452 is constituted by a patterned a-Si layer 452A and a patterned N-type doped a-Si layer 452B, and the patterning process is carried out by performing a photolithography and etching process, for example, which is not limited in the present invention. That is to say, the patterned semiconductor layer 452 can also be, for example, constructed by simultaneously implementing the patterning process and the film deposition process, such as the stencil printing process, the coating process, the energizer process, and so on.

Figure 5D:
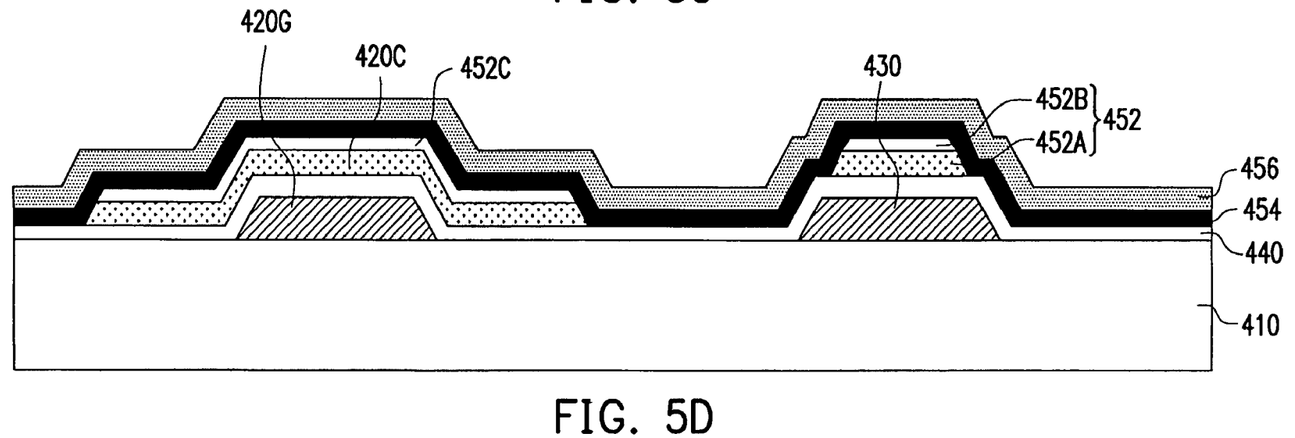

After that, referring to FIG. 5D, a barrier layer 454 and a conductive layer 456 are sequentially formed on the channel layer 420C, the dielectric layer 440, and the patterned semiconductor layer 452. In the present embodiment, the barrier layer 454 has the single-layered structure or the multi-layered structure and is made of copper oxide, which is not limited in the present invention. It notes that the copper oxide further comprising a copper alloy oxide, or combinations of the copper oxide and the copper alloy oxide. In other words, the above-mentioned other element can be soluble in the copper oxide and hence to formed a copper oxide solid solution or namely copper oxide mixture, for example. On the other hand, the conductive layer 456 has the single-layered structure or the multi-layered structure and is made of copper, the copper alloy, or combinations thereof. Here, the copper oxide has other element as a solute element to form a solid solution, mixture or the like, wherein the solute element comprising molybdenum, neodymium, zirconium, titanium, magnesium, nickel, hafnium, tungsten, tantalum, vanadium, tin, manganese, or combinations thereof. The concentration of oxygen in the copper oxide substantially ranges from 3% to 30%, for example, which is not limited in the present invention. The conductive layer 456 is, for example, made of the copper alloy and the copper alloy has other element as a solute element to form a solid solution, mixture, or the like, wherein the solute element comprising molybdenum, neodymium, zirconium, titanium, magnesium, nickel, hafnium, tungsten, tantalum, vanadium, tin, or manganese. Besides, the barrier layer 454 and the conductive layer 456 are, for example, formed by performing the CVD process, the sputtering process, the evaporation process, or other appropriate film deposition processes, which is not limited in the present invention. Alternatively, the barrier layer 454 and the conductive layer 456 can also be formed by simultaneously implementing the patterning process and the film deposition process, such as the stencil printing process, the coating process, the energizer process, and so on.

Figure 5E:
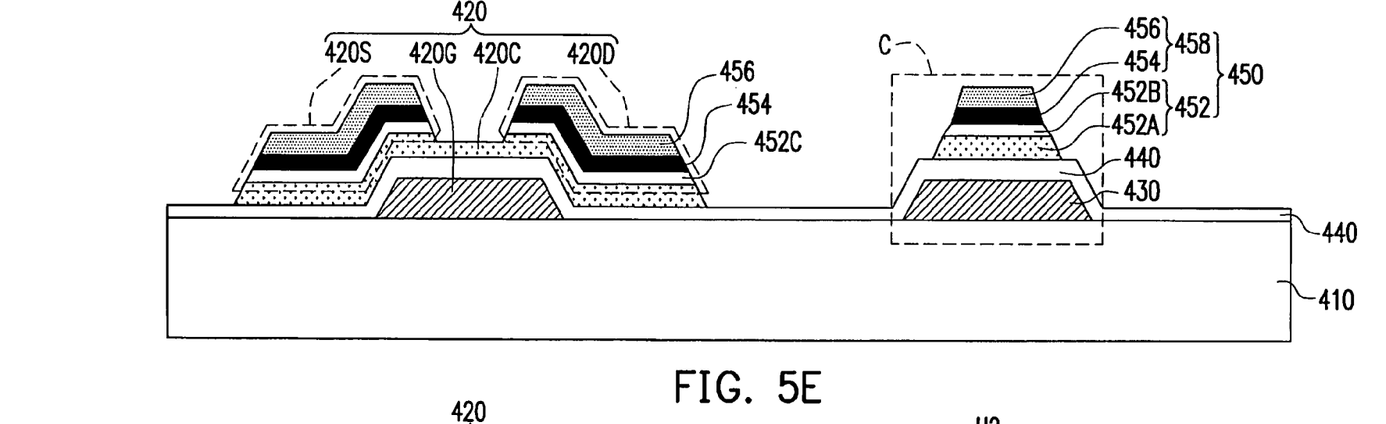

Thereafter, referring to FIG. 5E, the barrier layer 454 and the conductive layer 456 are patterned, so as to form a source 420S and a drain 420D on the channel layer 420C at respective sides of the gate 420G and to form a copper-containing stacked layer 458 on the patterned semiconductor layer 452. Note that the source 420S and the drain 420D are, for example, constituted by the ohmic contact layer 452C, the patterned barrier layer 454, and the conductive layer 456, respectively. The gate 420G, the channel layer 420C, the source 420S and the drain 420D together form a TFT 420, while the patterned semiconductor layer 452 and the copper-containing stacked layer 458 together construct an upper capacitor electrode 450. Hence, the bottom capacitor electrode 430, the dielectric layer 440, and the upper capacitor electrode 450 together form the storage capacitor C for maintaining the data voltage of a pixel structure 400 (illustrated in FIG. 5G). Moreover, in the TFT 420 depicted in FIG. 5E, it is preferable for the metal layer 456 and the barrier layer 454 in the source 420S and the drain 420D to be positioned within the projection area of the semiconductor layer 452. For example, the edges of the metal layer 456 and the barrier layer 454 in the source 420S and the drain 420D are aligned to the edge of the semiconductor layer 452. Here, the edges of the metal layer 456 and the barrier layer 454 and the edge of the semiconductor layer 452 are away from the gate 420G. In an alternative, the edges of the metal layer 456 and the barrier layer 454 away from the gate 420G are located within the edge of the semiconductor layer 452 away from the gate 420G. That is to say, in the present embodiment, a bottom surface of the barrier layer 454 is in contact with an upper surface of the semiconductor layer 452, which is not limited in the present invention. Portions of the metal layer 456 and the barrier layer 454 in the source 420S and the drain 420D are located within the semiconductor layer 452, while the other portions of the metal layer 456 and the barrier layer 454 in the source 420S and the drain 420D are disposed on the dielectric layer 440. In other words, the bottom surface of the barrier layer 454 is in contact with the upper surface of the semiconductor layer 452, at least one edge of the semiconductor layer 452, and an upper surface of the dielectric layer 440. Besides, the metal layer 456 in the source 420S and the drain 420D covers an upper surface of the barrier layer 454 and at least one edge thereof. Alternatively, the metal layer 456 and the barrier layer 454 in the source 420S and the drain 420D cover the upper surface of the semiconductor layer 452 and at least one edge thereof.

Figure 5F:
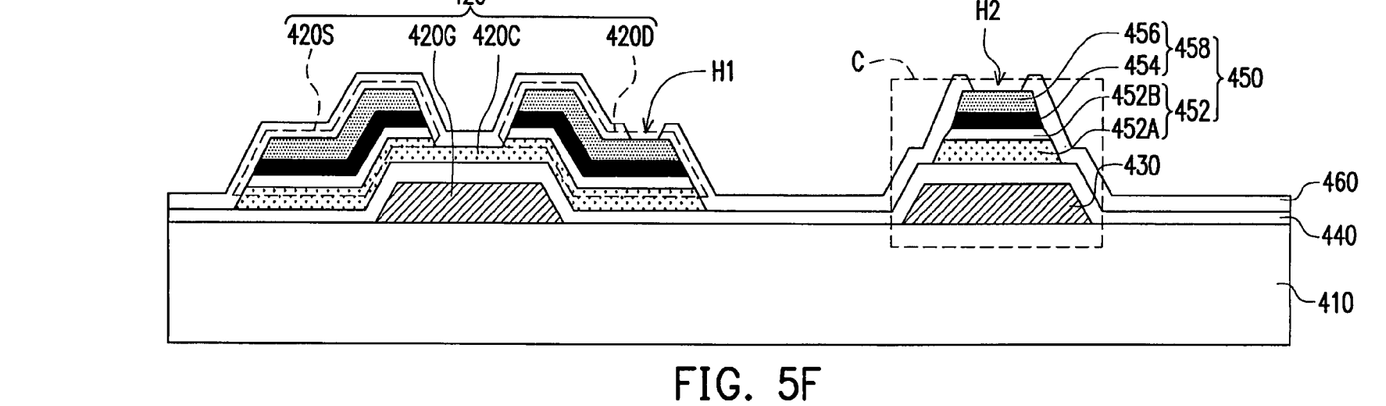

Afterwards, referring to FIG. 5F, a passivation layer 460 is formed on the TFT 420 and the upper capacitor electrode 450. The passivation layer 460 has at least one first opening H1 exposing the drain 420D. In the present embodiment, the passivation layer 460 further includes at least one second opening H2 exposing the upper capacitor electrode 450, which is not limited in the present invention. Namely, the second opening H2 can also be excluded from the passivation layer 460. The passivation layer 460 can be a single-layered structure or a multi-layered structure. In addition, the passivation layer 460 is made of the inorganic material (e.g. silicon nitride, silicon oxynitride, silicon oxide, any other material, or combinations thereof), any other dielectric material (e.g. FSG, BCB, PAE, parylene, fluoro-polymer, black diamond, HSQ, MSQ, polymethylmethacrylate, zinc oxide, hafnium oxide, any other material, or combinations thereof), or combinations thereof. In the present embodiment, the passivation layer 460 is made of the inorganic material such as silicon nitride or silicon oxide, and the passivation layer 460 is formed by thoroughly depositing the passivation layer 460 on the substrate 410 through performing the plasma CVD process. Thereafter, the passivation layer 460 is patterned to form at least one first opening H1 and at least one second opening H2. Alternatively, only at least one first opening H1 is formed. Note that the patterned semiconductor layer 452 can serve as the bottom buffer layer of the copper-containing stacked layer 458, so as to effectively prevent the copper-containing stacked layer 458 from being damaged by the plasma in the subsequent processes (e.g. the plasma CVD process). Thereby, no bubbles are generated in the copper-containing stacked layer 458, and the copper-containing stacked layer 458 is unlikely to be peeled off from the dielectric layer 440.

Figure 5G:
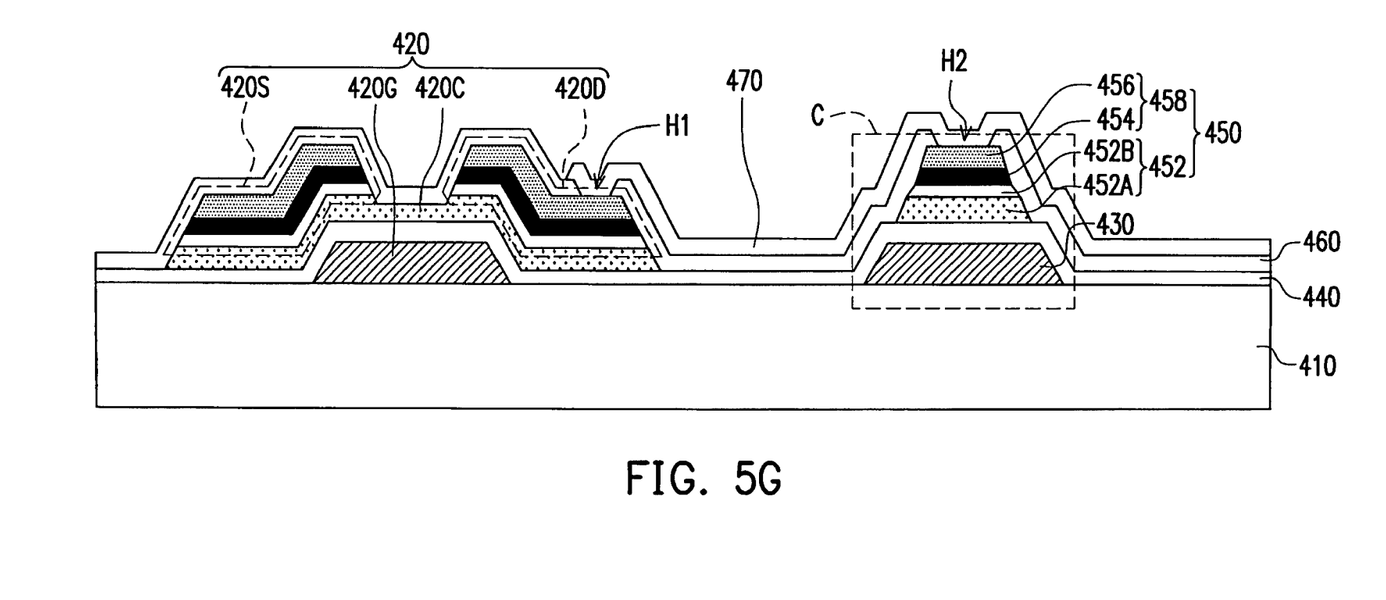

Next, referring to FIG. 5G, a pixel electrode 470 is formed. The pixel electrode 470 is formed on the passivation layer 460 by implementing a sputtering process and a patterning process, for example, which is not limited in the present invention. That is to say, the pixel electrode 470 can also be constructed by simultaneously implementing the patterning process and the film deposition process, such as the stencil printing process, the coating process, the energizer process, and so on. The pixel electrode 470 has the single-layered structure or the multi-layered structure and is made of the transparent material (e.g. indium tin oxide, indium zinc oxide, indium tin zinc oxide, aluminum tin oxide, aluminum zinc oxide, cadmium tin oxide, cadmium zinc oxide, hafnium oxide, any other material, or combinations thereof), the non-transparent material (e.g. gold, silver, copper, iron, tin, lead, aluminum, molybdenum, titanium, tantalum, tungsten, chromium, cadmium, neodymium, hafnium, any other material, oxide thereof, nitride thereof, oxynitride thereof, or combinations thereof), or combinations thereof. In the present embodiment, the pixel electrode 470 is made of the transparent material, such as the indium tin oxide and/or the indium zinc oxide, which is not limited in the present invention. The pixel electrode 470 is electrically connected to the TFT 420 through at least one first opening H1. If the passivation layer 460 further has at least one second opening H2, the pixel electrode 470 is electrically connected to the upper capacitor electrode 450 through the second opening H2. It should be noted that in another embodiment, the method of fabricating the pixel structure 400 further includes forming an etching stop layer (not shown) on the channel layer before the formation of the barrier layer 454. The etching stop layer can have the single-layered structure or the multi-layered structure.

Figure 6A:
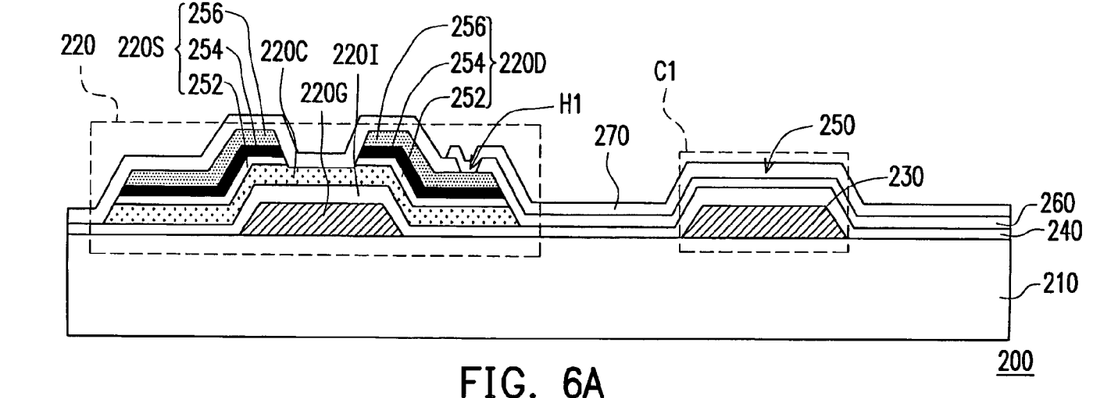
FIG. 6A is a schematic view illustrating a pixel structure according to the present invention.

It should also be mentioned that in another embodiment, the material of the source 220S and the drain 220D and the material of the upper capacitor electrode 250 can be substantially different. For example, given that the TFT depicted in FIG. 2A is taken to exemplify the present invention, the structure of the storage capacitor C in the pixel structure is normal style. However, the structure of the storage capacitor C is not limited in the present invention. Namely, at least one of the semiconductor layer 252, the barrier layer 254, and the metal layer 256 is not included in the storage capacitor C, for example, and the storage capacitor C lacking at least one of the semiconductor layer 252, the barrier layer 254, and the metal layer 256 is respectively depicted in FIGS. 6A, 6B, and 6C. In FIG. 6A, the bottom capacitor electrode 230 of a storage capacitor C1 has the same structure as the structure of the gate 220G, and the pixel electrode 270 is taken as the upper capacitor electrode 250 of the storage capacitor C1. Namely, the storage capacitor C1 is constituted by the bottom capacitor electrode 230, the pixel electrode 270, and the dielectric layer 240 and the passivation layer 260 which are sandwiched between the bottom capacitor electrode 230 and the pixel electrode 270. Certainly, at least one of the dielectric layer 240 and the passivation layer 260 can be selectively disposed between the bottom capacitor electrode 230 and the pixel electrode 270, which is not limited in the present invention. In addition, the TFT of the present embodiment can be of the same structure as that of the TFT depicted in FIG. 2B of the present invention.

Figure 6B:
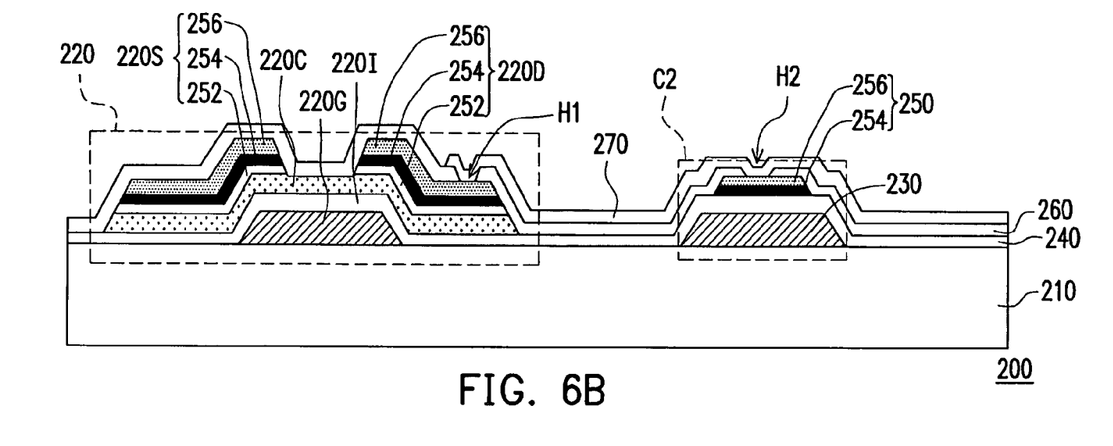
FIG. 6B is a schematic view illustrating a pixel structure according to the present invention.

Referring to FIG. 6B, the bottom capacitor electrode 230 of the storage capacitor C2 has the same structure as that of the gate 220G, and at least one of the semiconductor layer 252, the barrier layer 254, and the metal layer 256 is not included in the storage capacitor C2. As shown in FIG. 6B, the upper capacitor electrode 250 is constituted by the stacked barrier layer 254 and the metal layer 256. Besides, the dielectric layer 240 is disposed between the bottom capacitor electrode 230 and the pixel electrode 270, such that the storage capacitor C2 is formed. To resolve the conventional issue, the dielectric layer 240 of the present embodiment is preferably a silicon-rich dielectric layer including silicon-rich oxide, silicon-rich nitride, silicon-rich oxynitride, any other material, or combinations thereof, for example. Besides, in the present embodiment, the passivation layer 260 further includes at least one second opening H2 exposing the upper capacitor electrode 250, which is not limited in the present invention. Namely, the second opening H2 can also be excluded from the passivation layer 260.

Figure 6C:
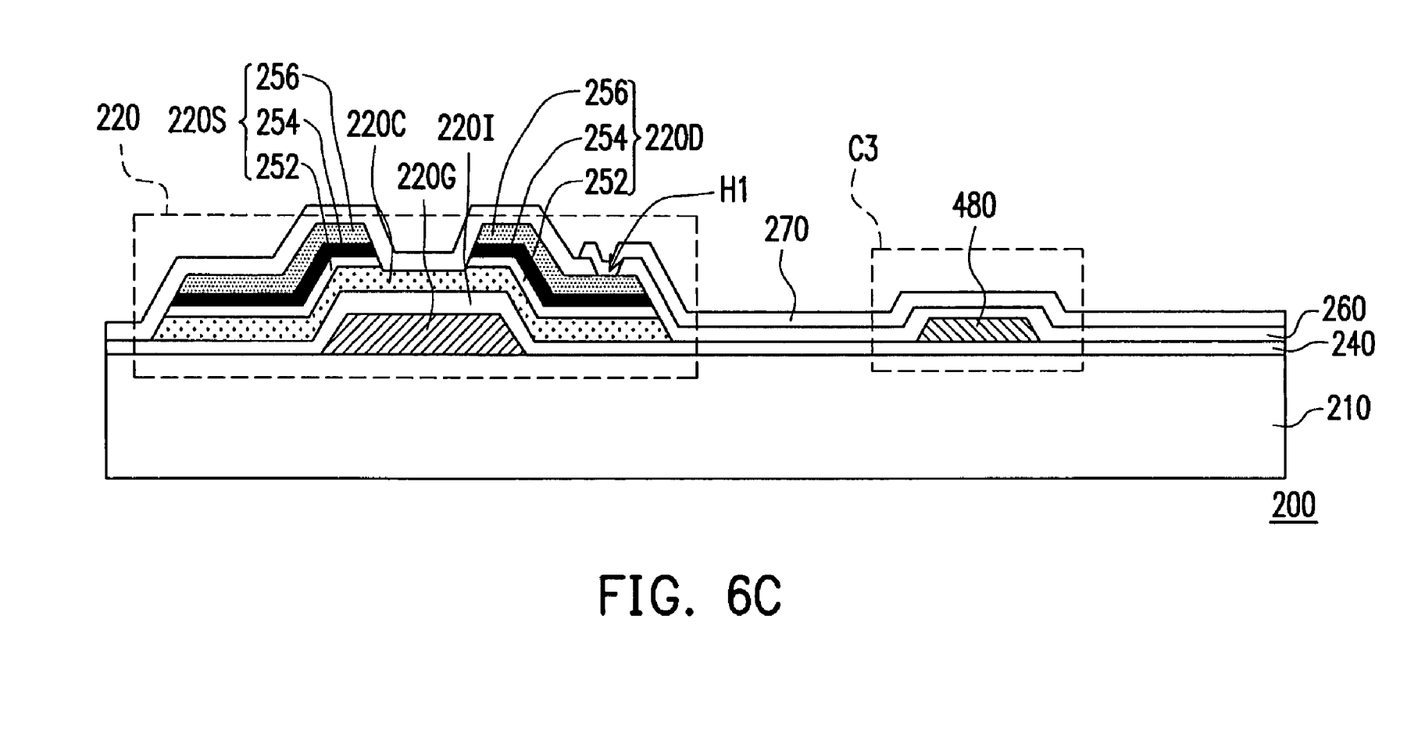
FIG. 6C is a schematic view illustrating a pixel structure according to the present invention.

FIG. 6C depicts another form of the storage capacitor. Referring to FIG. 6C, the bottom capacitor electrode 230 of a storage capacitor C3 is constituted by a metal layer 480 having the single-layered structure or the multi-layered structure, while the metal layer 480 contains no copper. The pixel electrode 270 is taken as the upper capacitor electrode 250 of the storage capacitor C3, and the passivation layer 260 is disposed between the bottom capacitor electrode 230 and the pixel electrode 270, so as to form the storage capacitor C3. Preferably, the bottom capacitor electrode 230 of the storage capacitor C3 is in contact with the substrate 210 and is made of the single-layered metal or the multi-layered metals containing no copper, which is not limited in the present invention. Moreover, the material of the upper electrode and/or the bottom electrode of the storage capacitor depicted in FIGS. 6A and 6B can be totally different from the material of the source/drain in the TFT. Namely, the source/drain in the TFT has the barrier layer and the metal layer made of copper or the copper alloy, whereas the material of the upper electrode of the storage capacitor and/or the bottom electrode of the storage capacitor can exclude the aforesaid copper-containing stacked layer. That is to say, the source/drain in the TFT and the upper electrode of the storage capacitor and/or the bottom electrode of the storage capacitor can be formed at the same time or at different times. Further, the storage capacitor C discussed in the previous embodiments includes Cs on common line, Cs on gate line, or a combination thereof. In other words, the bottom electrode of the storage capacitor C may be a common line, a portion of the gate, a portion of the gate line, an electrode simultaneously formed along with the source/drain, or combinations thereof. Besides, the storage capacitor C may also have a metal-insulator-ITO (MII) structure, a metal-insulator-metal (MIM) structure, or a combination thereof. On the other hand, only one TFT and one storage capacitor are taken to exemplify the present invention as discussed in the previous embodiments, which is not limited herein. A plurality of the TFTs and/or a plurality of the storage capacitors can also be taken for exemplifying the present invention.

Note that not only the metal layer and the barrier layer provided in the previous embodiments can be formed at the same time or at different times, but also the patterned semiconductor layer, the patterned metal layer, and the barrier layer can be formed at the same time, at different times, or by other manufacturing processes.

Figure 7:
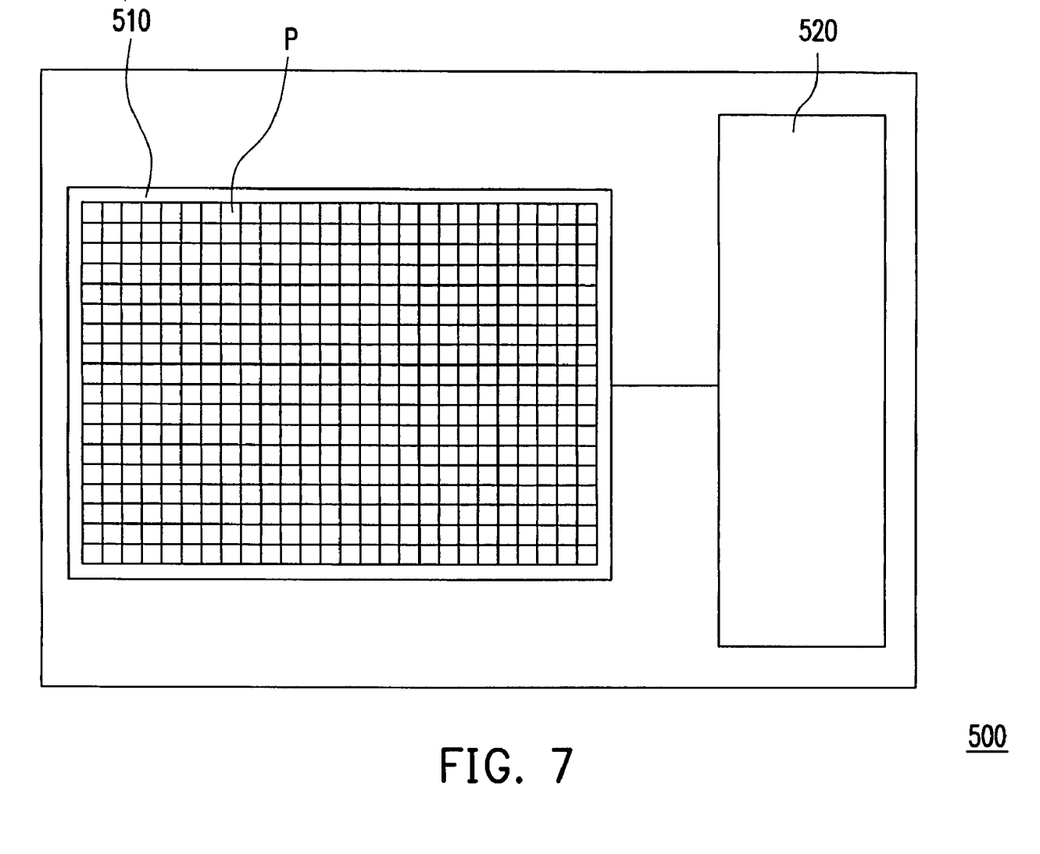
FIG. 7 is a schematic view illustrating an electro-optical apparatus according to the present invention.

FIG. 7 is a schematic view illustrating an electro-optical apparatus according to the present invention. Referring to FIG. 7, a display panel 510 having a pixel structure P provided in the previous embodiments can be electrically connected to an electronic device 520, so as to form an electro-optical apparatus 500. Here, the electronic device 520 includes a control device, an operating device, a treatment device, an input device, a memory device, a driving device, a light emitting device, a protection device, a sensing device, a detecting device, any other device having other functions, or combinations thereof. On the other hand, the electro-optical device 500 comprises a portable product (e.g. a mobile phone, a camcorder, a camera, a laptop computer, a game player, a watch, a music player, an e-mail receiver and sender, a map navigator, a digital picture, or the like), an audio-video product (e.g. an audio-video player or the like), a screen, a television, an outdoor/indoor bulletin, a panel in a projector, and so on.

Moreover, the finished display panel 510 at least includes a pixel array substrate having the pixel structure P discussed in the previous embodiments, another substrate opposite to said pixel array substrate and having a transparent electrode, and a display medium disposed between the pixel array substrate and the substrate opposite thereto. As the material of the display medium is a liquid crystal material, the display panel is referred to as the LCD panel (e.g. a transmissive display panel, a transflective display panel, a reflective display panel, a color-filter-on-array display panel, an array-on-color-filter display panel, a VA display panel, an IPS display panel, an MVA display panel, a TN display panel, an STN display panel, a PVA display panel, an S-PVA display panel, an ASV display panel, an FFS display panel, a CPA display panel, an ASM display panel, an OCB display panel, an S-IPS display panel, an AS-IPS display panel, an UFFS display panel, a PSA display panel, a dual-view display panel, a triple-view display panel, a three-dimensional display panel, any other display panel, or combinations thereof.) Here, the display panel is also referred to as a non-self illuminating display panel. In contradistinction, given that the display medium is made of an electro-luminescent material, the display panel is referred to as an electro-luminescent display panel (e.g. a phosphor electro-luminescent display panel, a fluorescent electro-luminescent display panel, or a combination thereof). Here, the display panel is also referred to as a self-illuminating display panel. The electro-luminescent material includes an organic material, the inorganic material, or a combination thereof. Furthermore, said material may be a small molecule material, a polymer material, or a combination thereof. Additionally, if the display medium includes the liquid crystal material and the electro-luminescent material at the same time, the display panel is referred to as a hybrid display panel or a semi-self-illuminating display panel.

The present invention further provides a method of manufacturing a display panel. In the method, the fabricating processes depicted in FIGS. 5A through 5G are included for forming the pixel array substrate. Next, the pixel array substrate and another substrate having the transparent electrode are assembled, and a display medium is disposed between said two substrates, so as to form the display panel 510. Moreover, the present invention further provides a method of manufacturing an electro-optical apparatus. In the method, the fabricating processes depicted in FIGS. 5A through 5G are included for forming the display panel. Thereafter, the electronic device 520 is electrically connected (not shown) to the display panel 510, so as to form the electro-optical apparatus 500 depicted in FIG. 7.

In summary, the pixel structure and the manufacturing method thereof as provided by the present invention have at least the following advantages:

The semiconductor layer is able to serve as the bottom buffer layer of the barrier layer and the metal layer made of copper, the copper alloy, or the combination thereof according to the present invention. Thereby, the metal layer and the barrier layer are not peeled off, or the bubbles are not generated during the implementation of the subsequent processes. Therefore, the devices (e.g. the storage capacitor or the TFT) are not affected and are still able to work, and the pixels can be normally operated.

The method of manufacturing the pixel structure is compatible with current manufacturing processes. Thus, the metal layer made of copper, the copper alloy, or combinations thereof is able to serve as the electrode or the lead of the pixel structure without disposing any additional equipment according to the present invention. Hence, the performance of the TFT device or the performance of the storage capacitor in the pixel structure can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure disposed on a substrate, the pixel structure comprising:
   a thin film transistor disposed on the substrate and having a gate, a source/drain and a channel layer;
   a bottom capacitor electrode disposed on the substrate;
   a dielectric layer disposed on the bottom capacitor electrode;
   an upper capacitor electrode, comprising:
      a semiconductor layer disposed on the dielectric layer above the bottom capacitor electrode, wherein the semiconductor layer and the channel layer are formed by different layers;
      a barrier layer disposed on the semiconductor layer; and
      a metal layer disposed on the barrier layer, the material of the metal layer comprising copper, a copper alloy, or a combination thereof;
   a passivation layer covering the thin film transistor and the upper capacitor electrode and having a first opening exposing the drain/source; and
   a pixel electrode electrically connected to the thin film transistor through the first opening.

2. The pixel structure of claim 1, wherein the material of the source and the drain is substantially the same as the material of the upper capacitor electrode.

3. The pixel structure of claim 2, wherein the thin film transistor further comprises an etching stop layer disposed above the channel layer.

4. The pixel structure of claim 1, wherein the passivation layer further comprises a second opening exposing the upper capacitor electrode, such that the pixel electrode is electrically connected to the upper capacitor electrode through the second opening.

5. The pixel structure of claim 1, wherein the material of the barrier layer comprises copper oxide, and the composition of the copper oxide further comprises molybdenum, neodymium, zirconium, titanium, magnesium, nickel, hafnium, tungsten, tantalum, vanadium, tin, manganese, or combinations thereof.

6. The pixel structure of claim 1, wherein the material of the barrier layer comprises copper oxide, in which the concentration of oxygen substantially ranges from 3% to 30%.

7. The pixel structure of claim 1, wherein the copper alloy has other element comprises molybdenum, neodymium, zirconium, titanium, magnesium, nickel, hafnium, tungsten, tantalum, vanadium, tin, or manganese.

8. A display panel, comprising the pixel structure of claim 1.

9. An electro-optical apparatus comprising the display panel of claim 8.

10. An electro-optical apparatus comprising the display panel of claim 9.

11. The pixel structure of claim 1, wherein both of the metal layer and the barrier layer are positioned within a projection area of the semiconductor layer.

12. The pixel structure of claim 1, wherein the barrier layer is positioned within a projection area of the semiconductor layer.

13. The pixel structure of claim 1, wherein the metal layer is positioned within a projection area of the semiconductor layer.

14. A method of manufacturing a pixel structure, the method comprising:
   providing a substrate;
   forming a gate and a bottom capacitor electrode on the substrate;
   forming a dielectric layer on the substrate to cover the gate and the bottom capacitor electrode;
   forming a channel layer on the dielectric layer above the gate and forming a semiconductor layer on the dielectric layer above the bottom capacitor electrode, wherein the semiconductor layer and the channel layer are formed by different layers;
   sequentially forming a barrier layer and a conductive layer on the channel layer, the dielectric layer, and the semiconductor layer, wherein the material of the conductive layer comprises copper, a copper alloy, or combinations thereof;
   patterning the barrier layer and the conductive layer to form a source and a drain on the channel layer at respective sides of the gate and forming a copper-containing stacked layer on the semiconductor layer, such that the gate, the channel layer, the source and the drain constitute a thin film transistor, while the semiconductor layer and the copper-containing stacked layer together form an upper capacitor electrode;
   forming a passivation layer on the thin film transistor and the upper capacitor electrode, wherein the passivation layer has a first opening exposing the drain; and
   forming a pixel electrode electrically connected to the thin film transistor through the first opening.

15. The method of claim 14, wherein the passivation layer further comprises a second opening exposing the upper capacitor electrode, such that the pixel electrode is electrically connected to the upper capacitor electrode through the second opening.

16. The method of claim 14, further comprising forming an etching stop layer on the channel layer before the formation of the barrier layer.

17. The method of manufacturing a display panel, comprising the method of manufacturing the pixal structure of claim 14.

18. A method of manufacturing an electro-optical apparatus, comprising the method of manufacturing the pixel structure of claim 17.

* * * * *